United States Patent [19]

Chu et al.

[11] Patent Number: 5,838,691
[45] Date of Patent: Nov. 17, 1998

[54] CODEBOOK-BASED LOSSY DATA COMPRESSION ENCODING SYSTEM

[75] Inventors: Ke-Chiang Chu, Saratoga; Dulce Ponceleon, Palo Alto; James Normile, Woodside, all of Calif.

[73] Assignee: Apple Computer, Inc., Cupertino, Calif.

[21] Appl. No.: 723,695

[22] Filed: Sep. 30, 1996

[51] Int. Cl.⁶ ............................................. G06F 11/00
[52] U.S. Cl. ................................................. 391/5.1
[58] Field of Search ...................... 371/5.1, 48; 375/240; 382/283; 707/101

[56] References Cited

U.S. PATENT DOCUMENTS 4,255,796  3/1981  Gabbe et al. ............................ 364/900
5,583,763  12/1996  Atcheson et al. ................... 364/551.01

OTHER PUBLICATIONS

Robert M. Gray, IEEE ASSP Magazine Article (Apr. 1984) entitled "Vector Quantization".

M. Rabbani, P. Jones, publication entitled "Digital Image Compression Techniques", vol. TT7, pp. 144–169.

Donald E. Knuth, "The Art of Computer Programming—Sorting and Searching", Sections 6.1 through 6.2.1, pp. 393–422 and Sections 6.2.3 through 6.2.4, pp. 451–471 (Addison–Wesley Publishing Company, 1973).

*Primary Examiner*—Phung M. Chung
*Attorney, Agent, or Firm*—Fenwick & West LLP

[57] ABSTRACT

A communication system encodes input data by comparing the data to records in a lossy codebook to determine the closest match. An index corresponding to the record that most closely matches the input data is retrieved from the codebook and transmitted to a receiver. For a predetermined sampling interval, the communication system collects statistics of the frequency of occurrence of each record matching the input data. The records are sorted in descending order by the frequency of occurrence. Using either a predetermined error rate or a predetermined subtable size, the communication system creates a subtable of the records having the greatest frequency of occurrence. To reduce the search time of finding a record matching the input data, the communication system searches only the subtable for records until the error of the match in the subtable exceeds a preselected threshold or until a preselected period of time has elapsed. The communication system again collects statistics of the frequency of occurrence.

10 Claims, 4 Drawing Sheets

CODEBOOK-BASED LOSSY DATA COMPRESSION ENCODING SYSTEM

FIELD OF THE INVENTION

This invention relates to an encoding system having a lossy codebook, and more particularly to an encoding system that searches a portion of a codebook based on the characteristics of the message and an encoding error threshold.

BACKGROUND OF THE INVENTION

Communication systems typically encode and decode messages between a transmitter and receiver. In one such communication system, an encoder at the transmitter and a decoder at the receiver each include an identical codebook that may be fixed and predefined or may change adaptively. The codebook includes a list of records and an index for each record. During an encoding process, the encoder searches the codebook for a record that matches input data. In a lossless coding system, the encoder searches the codebook for a record that exactly matches the input data. In a lossy coding system, the encoder searches for the record that most closely matches the input data. Upon detecting a match, the encoder retrieves the index corresponding to the matching record from the codebook. The encoder transmits the index to the decoder in the receiver. During the decoding process, the decoder searches the codebook in the receiver for the record having an index that matches the received index.

In this encoding system, the search of the codebook for a match to the input data is time consuming. Efficient search algorithms, such as binary search or balanced tree searches, cannot be used in lossy coding systems. Binary and balanced tree search algorithms are described in Donald E. Knuth, *The Art Of Computer Programming-Sorting and Searching,* Addison-Wesley Publishing Company (1973). These algorithms search for an entry that is related to a value or search key of the searched item. Thus, the codebook is organized in such a manner that the search may be terminated quickly. For example, in the binary algorithm, the records in the codebook are arranged by their keys in an increasing or decreasing order. The binary search locates a record in the table, if it is in the table, in $\log_2 N$ cycles for an N-record search. However, the binary search algorithm cannot be used in a lossy coding system because the search in such a system is not for an exact matching pattern for the search key. Instead, the search is for a record $R_i$ and a corresponding key $K_i$ that minimizes the error function $E(K, K_2)$. Because the error function is a function of both the search key K and the key $K_i$ in the target record, the records cannot be pre-sorted by the error function.

For lossy coding systems, a sequential search algorithm is usually used in which each record of the table is searched and the record having the minimum error is selected. This algorithm locates the record in N cycles for an N-record search and N error calculations. This algorithm is very time consuming. The sequential search algorithm is described in Donald E. Knuth, *The Art Of Computer Programming-Sorting and Searching,* Addison-Wesley Publishing Company (1973).

One solution to reduce the search time is to set an error threshold Te for the search. The codebook is searched sequentially. For the i-th search, the record $R_i$ is searched and the error function $E(K, K_i)$ is calculated. If the calculated error $E(K, K_i)$ is higher than the error threshold Te, the next record is searched unless the end of the table is reached. For the latter case, the search is unsuccessful. If the calculated error $E(K, K_i)$ is below the error threshold Te, the search is terminated and record $R_i$ becomes the data that is encoded. This search algorithm is described in Robert M. Gray, "Vector Quantization," *IEEE ASSP Magazine,* Vol. 1, p 4–29 (April 1984).

In such a searching algorithm, the selection of the error threshold Te is critical. An optimal solution is not reached if the error threshold Te is set too high. If the error threshold is set too low, the search is likely to be unsuccessful. In such an event, the error threshold is raised and the search is repeated. The search process takes more time than a conventional sequential search. In some applications, the error threshold Te fluctuates quickly and must be adjusted almost every cycle. The search time in these applications is greater than the sequential search method.

It is desired to have an encoding system that reduces the searching time of a lossy codebook but does not require multiple searches of the codebook for any input datum.

SUMMARY OF THE INVENTION

The present invention provides a method and apparatus for searching a codebook that includes a plurality of records and a plurality of codes. Each of the plurality of records has an associated one of the plurality of codes. For each of the plurality of records, the frequency of occurrence of receiving input data matching the record is determined. The records are sorted, in descending order, by frequency of occurrence. A record is selected that matches a received input from the sorted records that have the M greatest frequencies of occurrence. The code associated with the selected record is retrieved.

The error between the selected record and the received input is determined. The determination of the frequency of occurrence is repeated if the average error determined for a record is greater than a predetermined threshold.

Alternatively, the determination of the frequency of occurrence is repeated if the time elapsed after the first determination of the frequency of occurrence is greater than a predetermined threshold.

A communication system includes a memory that stores a codebook comprising a plurality of records and a plurality of codes. Each record has an associated code. An encoding program determines the frequency of occurrence of receiving input data matching each record, sorts the records by frequency of occurrence in descending order, selects a record that matches a received input from the sorted records that have a selected number M greatest frequencies of occurrence, and retrieves from the memory the code associated with the selected record. A processor executes the encoding program. Alternatively, the encoding may be hardware implemented.

DETAILED DESCRIPTION OF THE PREFERRED EMBODIMENTS

Figure 1:
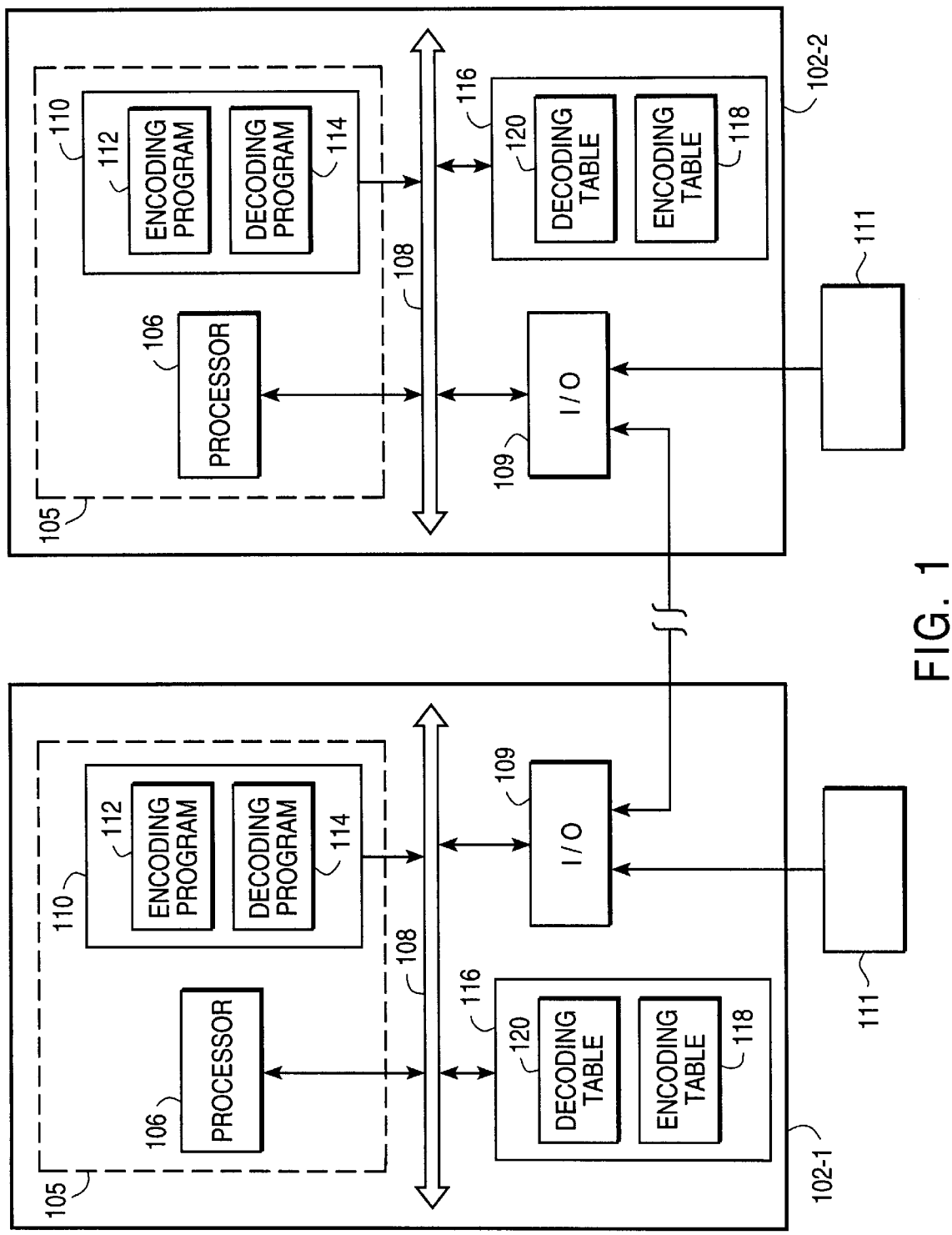
FIG. 1 is a block diagram illustrating a communication system using codebook-based lossy data compression encoding in accordance with the present invention.

Referring to FIG. 1, there is shown a block diagram illustrating a communication system 100 using codebook-based lossy data compression. The lossy data compression may be executed by software or hardware. A software embodiment is described herein. The communication system 100 includes a plurality of communication units 102 and a communication channel 104 coupling the communication units 102-1 and 102-2. For clarity, only two communication units 102-1 and 102-2 are shown. The communication system 100 may be, for example, a video conference system and the communication units 102 may be, for example, a video conference station that includes a video camera and a viewer.

Each communication unit 102 includes a decoding/encoding engine 105, an input/output (I/O), a bus 108, an interface 109, and a working memory 116. The decoding/encoding engine 105 includes a general purpose processor 106 and a program memory 110. The general purpose processor 106 communicates data with the bus 108. The input/output (I/O) interface 109 receives data from an input device 111, such as a microphone or a video camera, and communicates with the communication channel 104. The decoding/encoding engine 105 generates a code for each data input received from the I/O interface 109 and provides the code to the I/O interface 109 for communication with another communication unit. In addition, the decoding/encoding engine 105 receives a code from another communication unit 102 through the I/O interface 109 and generates a data value for that code.

The program memory 110 includes an encoding program 112 and a decoding program 114. The working memory 116 includes an encoding table 118 and a decoding table 120. The program memory 110 may be, for example, a nonvolatile storage medium, such as a hard disk, a floppy disk, or electrically erasable programmable read only memory.

Figure 2:
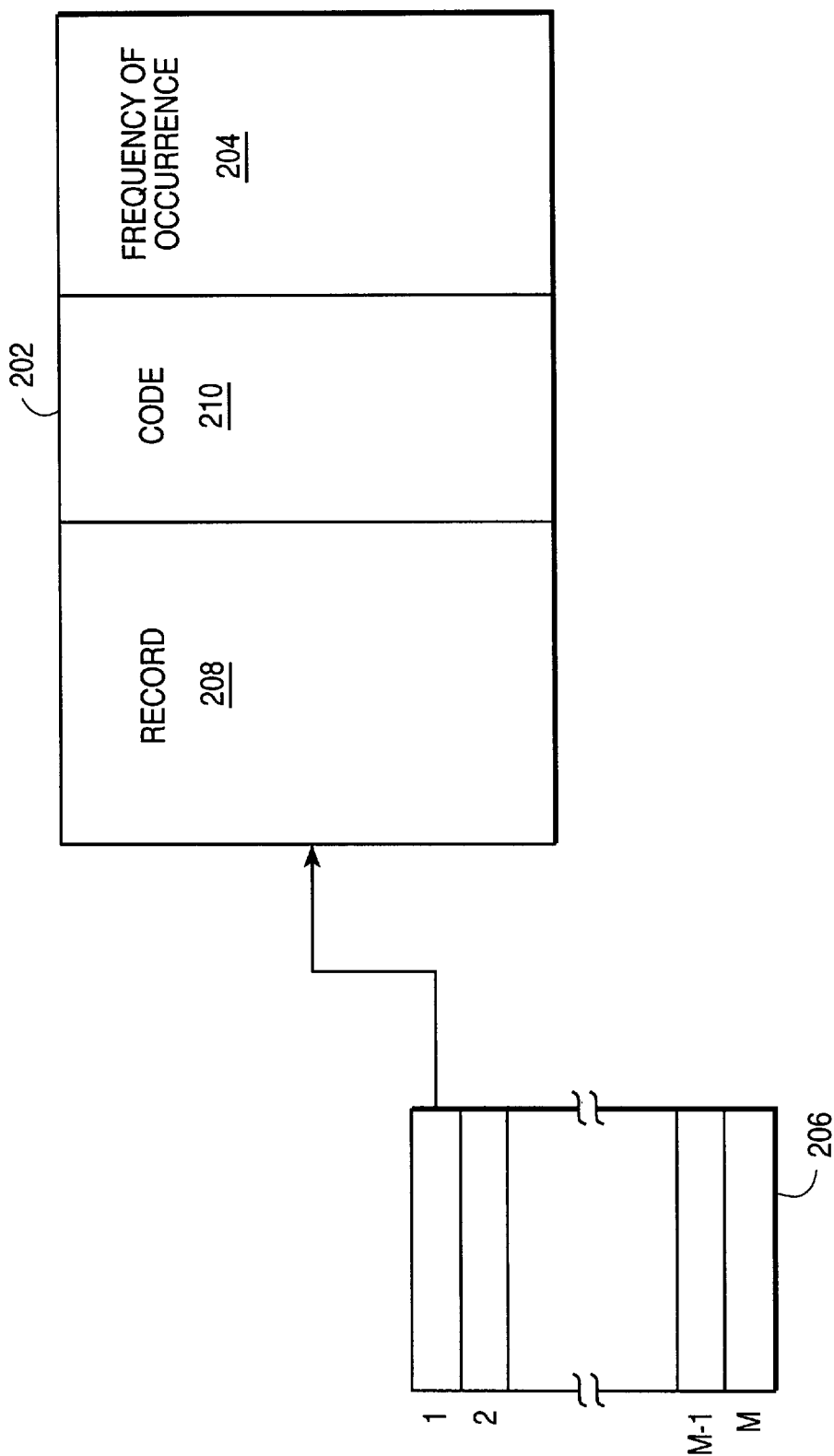
FIG. 2 is a block diagram illustrating a codebook for the communication system of FIG. 1.

Referring to FIG. 2, there is shown a block diagram illustrating the encoding table 118. The encoding table 118 includes a codebook 202, a frequency of occurrence table 204, and a pointer table 206. The codebook 202 includes a plurality of records 208 and a plurality of codes 210. Each record 208 of the codebook 202 has an associated code 210. The code 210 is an index that is sent by one of the communication units 102 to another communication unit 102, which then compares the received index to the codes 210 in its decoding table 120. Upon a match, the second communication unit 102 retrieves from the codebook 202 the record 208 corresponding to the matched code.

The frequency of occurrence table 204 stores, for each record 208, the number of occurrences during a sampling period that the record 208 most closely matches one of the input data. The frequency of occurrence table 204 preferably is updated either periodically or if the average error between the input data and the record 208 most closely matching the input data exceeds a certain threshold, as described below.

The pointer table 206 stores a pointer for each of a number M records 208 having the greatest frequency of occurrence during the sampling period. The number M may be user selected. The selection of the number M may be based, for example, on an acceptable error rate or available search time. Say that the codebook 202 has a number N records 208 and, for illustrative purposes, that Table I shows, for a measured sample, the percentage of the input data that are in the M records 208 having the M greatest frequencies of occurrence.

TABLE I

| M | % |
|---|---|
| N | 100 |
| N/2 | 98 |
| N/4 | 91 |
| N/8 | 75 |
| N/16 | 50 |

After the number M is selected, the records 208 are sorted in descending order and the records 208 having the M highest frequency of occurrence are determined.

A pointer for each of the M records 208 in descending order is stored in the pointer table 206. Because the pointer table 206 stores only M pointers, the size of the pointer table 206 may be fixed if the number M is fixed or may be variable if the number M is variable. Alternatively, the pointer table 206 may store a pointer for each of the N records 208 in the codebook 202. The encoding program 112 sequentially retrieves pointers in the pointer table 206 to thereby point to the records 208 in descending order of frequency of occurrence. Upon completion of a search, the encoding program resets a record counter to begin the next search at the beginning of the pointer table 206.

Thus, using the statistics of Table I for illustrative purposes, 98% of the sampled input data most closely matches N/2 records 208 or one-half of the records 208 in the codebook 202. If the user accepts an error rate such that approximately 2% of the received data does not provide the best match to the entire codebook 202, the pointer table 206 can include one-half the entries of the entire codebook 202 and thereby reduce the search time to one-half of the search time of the entire codebook 202. Similarly, an error rate of 9% allows a pointer table of N/4 records 208 and a search time is reduced to 25% of the search time of the entire codebook 202. For video conference systems, the error rate is preferably between 75% and 91% and the corresponding number M preferably is between N/4 and N/8.

The decoding table 120 preferably is in the form of a decoding lookup table that contains the records 208 and codes 210 of the codebook 202 organized by the codes 210. The processor 106 accesses and executes the encoding program 112 and the decoding program 114 in the program memory 110 to carry out the desired encoding and decoding functions of the communication system 100. The encoding process is described below in conjunction with FIGS. 3–4.

With regard to the decoding process, the decoding table 120 either is predefined from the encoding table, changes adaptively, is stored in the working memory 116, or may be generated by the processor 106 in accordance with a predefined program. Once the decoding table 120 is in place, the processor 106 executes the decoding process by receiving an incoming data stream of indices from the communication channel 104 and comparing the received datum with the codes in the decoding table 120 to find, for each received index, a code matching the received datum and to thereby retrieve the corresponding record 208 from the decoding table 120. Alternatively, the codebook 202 may be used instead of the decoding table 120.

Figure 3:
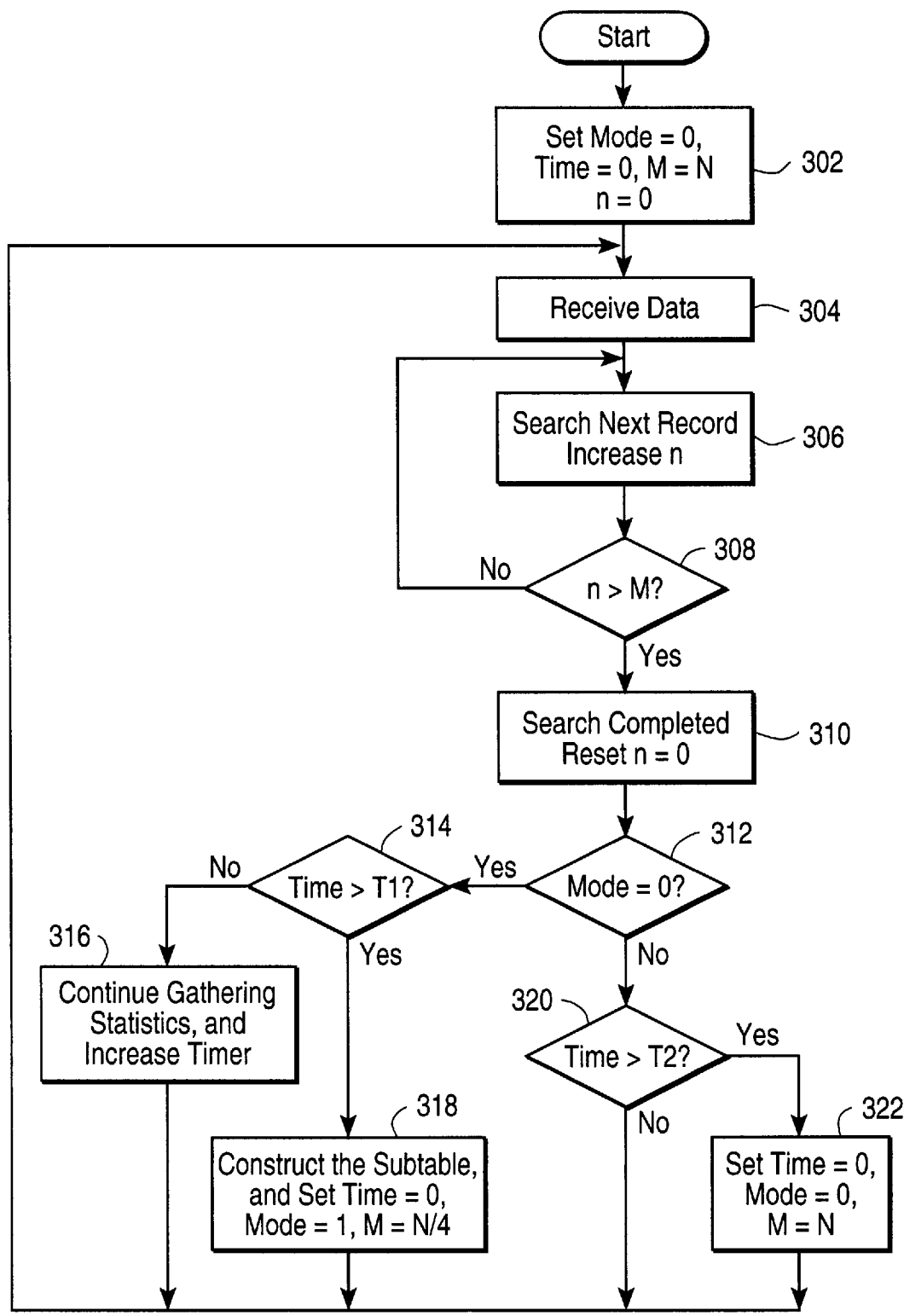
FIG. 3 is a flowchart illustrating the process of updating, on a periodic basis, a pointer table to the codebook of the communication system of FIG. 1.

Referring to FIG. 3, there is shown a flowchart illustrating the process of updating, on a periodic basis, the pointer table 206 to the codebook 202 of the communication system 100. During a statistics determination period, the encoding program 112 determines, for a sampling interval, the frequency of occurrence of received input data matching records 208 in the codebook 202. The encoding program 112 initializes 302 a set of parameters. Specifically, the encoding program 112 sets a mode flag to zero to indicate that the encoding program 112 is to collect and determine the statistics of the received data, resets a timer to time equal to zero, sets a table size parameter (M) equal to the number (N) of records 208 in the codebook 202, and sets a record counter (n) to zero.

The processor 106 receives 304 data from the input device 111. The input data may be, for example, audio data that is sampled and digitized. The encoding program 112 searches 306 the codebook 202 for the record 208 corresponding to the count of the record counter and calculates the "match" between the record 208 and the input data. The "match" may be, for example, an error calculation, such as the difference between the record 208 and the input data. The encoding program 112 increments the record counter n and determines 308 whether the record 208 is the last record in the codebook 202, i.e. whether the record counter n equals the table size parameter M. During the statistics determination mode, the table size parameter equals the size of the codebook 202, or N records. During a reduced codebook mode, the table size parameter equals the number of records M that is user specified as described above. If the record 208 is not the last record, the processor searches 306 the codebook 202 for the next record 208 as described above.

On the other hand, if the record 208 is the last record, the search of the codebook 202 is complete and the encoding program 112 resets 310 the record counter n to zero. The encoding program 112 determines the record 208 of the codebook 202 that most closely matches the input data. The closest match may be, for example, the smallest error between the record 208 and the input data. If 312 the mode flag equals zero, i.e. the encoding program 112 is in the statistics determination mode, the encoding program 112 determines 314 whether the sampling interval period is completed by determining whether the timer is greater than a first predetermined threshold (T1), which is a table construction time. The first predetermined threshold (T1) is preferably about 5 seconds. If 314 the timer is not greater than the first predetermined threshold (T1), the encoding program 112 increments 316 the timer and collects statistics of the input data by incrementing the count in the frequency of occurrence table 204 corresponding to the record 208 that most closely matches the input data. The encoding program 112 returns to receiving 304 the next input data as described above.

If 314 the timer is greater than the first predetermined threshold (T1), the encoding program 112 has completed the sampling interval and has completed gathering sample statistics. The encoding program 112 completes 318 the statistics determination mode by calculating, for each record 208, the frequency of occurrence statistics that the received input data matches the records 208 for the input data received during the sampling interval. The encoding program 112 constructs the pointer table 206, which is a subtable of the codebook 202 based on the frequency of occurrence of the records 208 in the codebook 202 and a user selected level of error. The user selected level of error may be, for example, user selected in real time after the determination of the statistics or preselected. The encoding program 112 constructs the subtable by sorting, in descending order, the records 208 in the codebook 202 by the frequency of occurrence of the record 208 in the sample and then selecting the records 208 having the M greatest frequencies of occurrence. The encoding program 112 generates a pointer to each of these M records and stores the pointer in the pointer table 206. As described above, the size of the subtable varies with the parameter M and with the user selected level of error. The encoding program 112 sets the mode flag to one to indicate a reduced codebook mode in which the search for records 208 is to be in the subtable, resets the time to time equal to zero, and sets the table size parameter M to a level determined from the user selected level of error. The encoding program 112 returns to receiving the next input data described above except that the search for data is of records 208 in the subtable.

After the search of the codebook 202 is complete and the processor resets the record counter n to zero, if the mode flag equals 312 one, i.e. the encoding program 112 is in a subtable search mode, the encoding program 112 determines whether the timer is greater than a second predetermined threshold (T2), which is a table valid time. The predetermined threshold (T2) is preferably about 5 minutes. If the timer is not greater than the second predetermined threshold (T2), the encoding program 112 returns to receiving 304 the next input data and searching for the record 208 in the subtable matching the input data as described above. Otherwise, if the timer is greater than the second predetermined threshold (T2), the encoding program 112 has timed out for this set of statistics and initializes 322 itself for another statistics determination mode by setting the mode flag to zero to indicate that a statistics gathering mode, resetting the timer to time equal to zero, and setting the table size parameter M equal to the number N of records 208 in the codebook 202. The encoding program 112 returns to receiving 304 the next input data and searching 306 for the record 208 in the subtable matching the input data described above.

Figure 4:
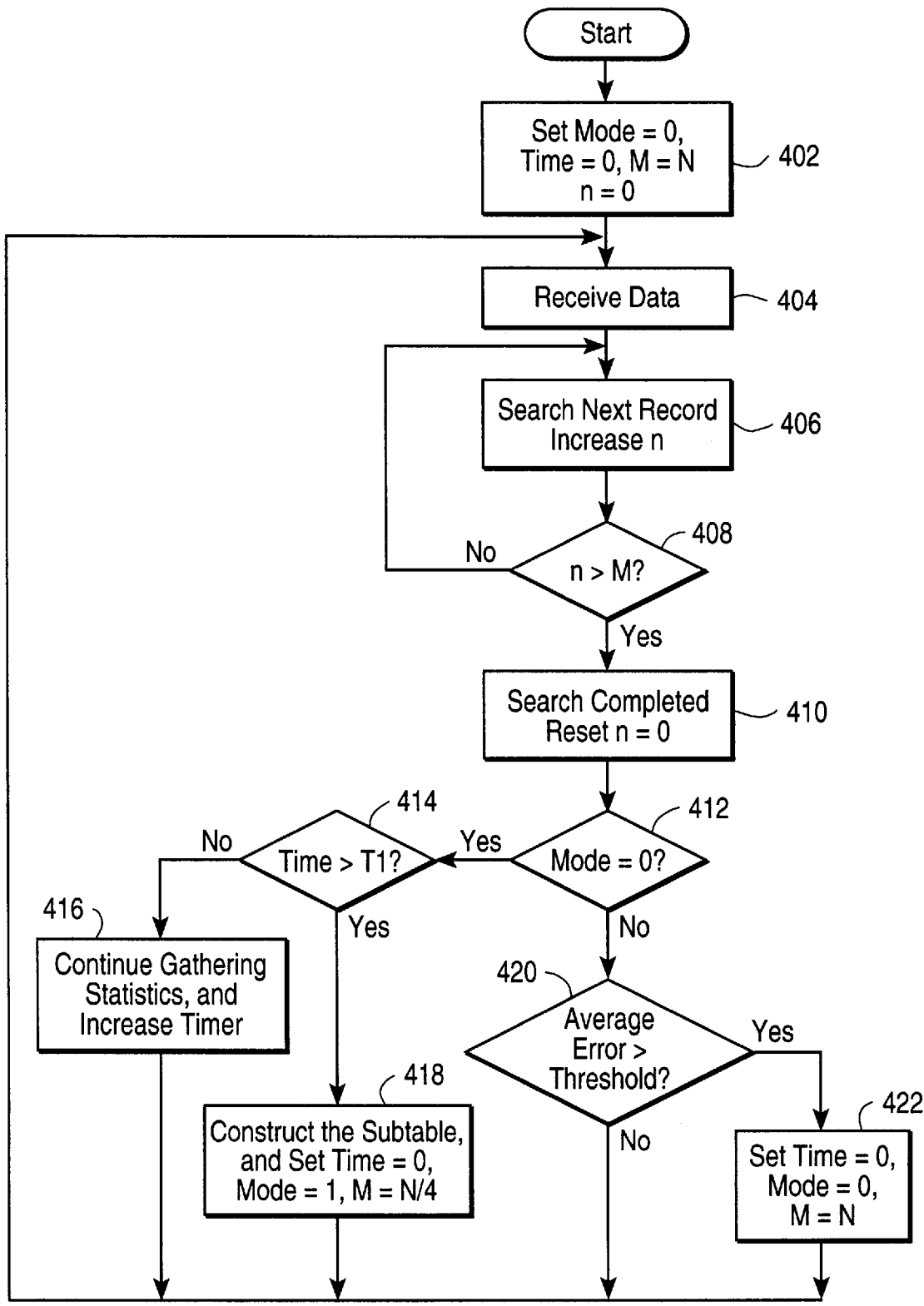
FIG. 4 is a flowchart illustrating the process of updating the pointer table responsive to an error calculation.

Referring to FIG. 4, there is shown a flowchart illustrating the process of updating the pointer table 206 subtable responsive to an error calculation. This process is similar to that of FIG. 3, except that the encoding program 112 returns to the statistics determination period if the average error of the record 208 in the subtable most closely matching the input data exceeds a certain threshold.

During a statistics determination period, the encoding program 112 determines, for a sampling interval, the frequency of occurrence of received input data matching records 208 in the codebook 202. The encoding program 112 initializes 402 a set of parameters. Specifically, the encoding program 112 sets a mode flag to zero to indicate that the encoding program 112 is to collect and determine the statistics of the received data, resets a timer to time equal to zero, sets a table size parameter (M) equal to the number (N) of records 208 in the codebook 202, and sets a record counter (n) to zero.

The processor 106 receives 404 data from the input device 111. The input data may be, for example, audio data that is sampled and digitized. The encoding program 112 searches 406 the codebook 202 for the record 208 corresponding to the count of the record counter and calculates the "match" between the record 208 and the input data. The "match" may be, for example, an error calculation, such as the difference between the record 208 and the input data. The encoding program 112 increments the record counter n and determines 408 whether the record 208 is the last record in the codebook 202, i.e. whether the record counter n equals the table size parameter M. During the statistics determination mode, the table size parameter equals the size of the codebook 202, or N records. During a reduced codebook mode, the table size parameter equals the number of records M that is user specified as described above. If the record 208 is not the last record, the processor searches 406 the codebook 202 for the next record 208 as described above.

On the other hand, if the record 208 is the last record, the search of the codebook 202 is complete and the encoding program 112 resets 410 the record counter n to zero. The encoding program 112 determines the record 208 of the codebook 202 that most closely matches the input data. The closest match may be, for example, the smallest error between the record 208 and the input data. If 412 the mode flag equals zero, i.e., the encoding program 112 is in the statistics determination mode, the encoding program 112 determines 414 whether the sampling interval period is completed by determining whether the timer is greater than a first predetermined threshold (T1). The first predetermined threshold (T1) is preferably about 5 seconds. If 414 the timer is not greater than the first predetermined threshold (T1), the encoding program 112 continues to gather statistics of the input data by incrementing 416 the timer and incrementing the count in the frequency of occurrence table 204 corresponding to the record 208 that most closely matches the input data. The encoding program 112 returns to receiving 404 the next input data as described above.

If 414 the timer is greater than the first predetermined threshold (T1), the encoding program 112 has completed the sampling interval and has completed gathering samples. To complete the statistics determination mode, the encoding program 112 determines 418 the frequency of occurrence statistics, described above, for this set of samples. The encoding program 112 constructs the pointer table 206, which is a subtable of the codebook 202 based on the frequency of occurrence of the records 208 in the codebook 202 and a user selected level of error. The user selected level of error may be, for example, user selected in real time after the determination of the statistics or preselected. The encoding program 112 constructs the subtable by sorting, in descending order, the records 208 in the codebook 202 by the frequency of occurrence of the record 208 in the sample and then selecting the records 208 having the M greatest frequencies of occurrence. The encoding program 112 generates a pointer to each of these M records and stores the pointer in the pointer table 206. As described above, the size of the subtable varies with the parameter M and with the user selected level of error. The encoding program 112 sets the mode flag to one to indicate a reduced codebook mode in which the search for records 208 is to be in the subtable, resets the time to time equal to zero, and sets the table size parameter M to a level determined from the user selected level of error. The encoding program 112 returns to receiving 404 the next input data as described above except that the search for data is of records 208 in the subtable.

After the search of the codebook 202 is complete and the processor resets the record counter n to zero, if the mode flag equals 412 one, i.e. the encoding program 112 is in a subtable search mode, the encoding program 112 determines whether the error of the record most closely matching the input data is greater than a predetermined average error threshold (Te). If the average error is not greater than the predetermined error threshold (Te), the encoding program 112 returns to receiving 404 the next input data and searching for the record 208 in the subtable matching the input data as described above. Otherwise, if the average error of the record most closely matching the input data is greater than the predetermined error threshold (Te), the encoding program 112 initializes 422 itself for another statistics determination mode by setting the mode flag to zero to indicate that the statistics gathering mode, resetting the timer to time equal to zero, and setting the table size parameter M equal to the number N of records 208 in the codebook 202. The encoding program 112 returns to receiving 404 the next input data and searching 406 for the record 208 in the codebook matching the input data as described above.

The communication system 100 provides encoding that reduces the search time of a lossy codebook for a record therein that most closely matches the input data by allowing the user or a system administrator to select a level of error of the encoding and then not searching records that occur less frequently in the input data.

We claim:

1. A method for searching a codebook comprising a plurality of records and a plurality of codes, each record having an associated code, the method comprising:

(a) determining during a sample period, for each of the plurality of records, a frequency of occurrence of receiving input data matching the record;

(b) sorting the records by their frequency of occurrence;

(c) selecting a record that matches a received input from the sorted records that have a selected number M greatest frequencies of occurrence; and (d) retrieving the code associated with the selected record.

2. The method of claim 1 further comprising the steps of:

(e) determining the error between the selected record and the received input and (f) repeating steps (a) and (b) if the error is greater than a predetermined threshold.

3. The method of claim 1 further comprising the steps of:

(e) determining the time elapsed after step (a) and (f) repeating steps (a) and (b) if the elapsed time is greater than a predetermined threshold.

4. The method of claim 1, wherein the records are sorted by their frequency of occurrence in descending order.

5. A communication system comprising:

a memory for storing a codebook comprising a plurality of records and a plurality of codes, each record having an associated code;

a receiver for receiving input data;

an encoding program for determining, during a sampling period, a frequency of occurrence of receiving input data matching each record, for sorting the records by their frequency of occurrence, for selecting a record that matches a received input from the sorted records that have a selected number M greatest frequencies of occurrence, and for retrieving from the memory the code associated with the selected record; and a processor for executing the encoding program.

6. The communication system of claim 5 further comprises:

a pointer table storing a plurality of pointers, each pointer corresponding to one of the plurality of records, and the encoding program further generates, for each of the sorted records that have a selected number M greatest frequencies of occurrence, a corresponding one of the plurality of pointers, and the encoding program retrieves one of the plurality of pointers from the pointer table corresponding to the selected record and retrieves the code corresponding to said one of the plurality of pointers from the memory.

7. The communication system of claim 5, wherein the encoding program sorts the records by their frequency of occurrence in descending order.

8. The communication system of claim 5, wherein the memory stores an encoding table including the codebook, a frequency of occurrence table, and a pointer table, the frequency of occurrence table including, for each record, the number of occurrences during a sampling period that the record substantially matches the input data, the pointer table for storing a pointer for each of the selected number M records in the codebook having the greatest frequency of occurrence during the sampling period.

9. The communication system of claim 8, wherein the pointer table is a subtable of the codebook and is constructed based on the frequency of occurrence of the records in the codebook and a user selected level of error.

10. The communication system of claim 8, wherein the pointer table is periodically updated during a statistics determination period.

* * * * *